(12) United States Patent
Kimura (10) Patent No.: US 7,336,344 B2
(45) Date of Patent: Feb. 26, 2008

(54) POSITIONING SYSTEM, EXPOSURE APPARATUS USING THE SAME, AND DEVICE MANUFACTURING METHOD

(75) Inventor: Atsushi Kimura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 84 days.

(21) Appl. No.: 11/063,576

(22) Filed: Feb. 24, 2005

(65) Prior Publication Data

US 2005/0185167 A1 Aug. 25, 2005

(30) Foreign Application Priority Data

Feb. 25, 2004 (JP) ............... 2004-048921

(51) Int. Cl.
  G03B 27/62 (2006.01)
  G03B 27/58 (2006.01)
(52) U.S. Cl. .......................... 355/75; 355/72
(58) Field of Classification Search ............. 355/53, 355/72, 75; 310/10, 12, 15
See application file for complete search history.

(56) References Cited

U.S. PATENT DOCUMENTS

| 6,570,645 | B2 | 5/2003 | Korenaga et al. ............. 355/75 |
| 7,034,474 | B2* | 4/2006 | Yang et al. ................. 318/135 |
| 2002/0145721 | A1 | 10/2002 | Korenaga et al. ............. 355/75 |
| 2003/0007140 | A1* | 1/2003 | Korenaga .................... 355/72 |
| 2003/0067592 | A1* | 4/2003 | Tim Poon et al. ............ 355/75 |
| 2003/0098966 | A1 | 5/2003 | Korenaga et al. ............. 355/75 |

FOREIGN PATENT DOCUMENTS

| JP | 2000-106344 | 4/2000 |
| JP | 2003-22960 | 1/2003 |

* cited by examiner

*Primary Examiner*—Henry Hung Nguyen
(74) *Attorney, Agent, or Firm*—Fitzpatrick, Cella, Harper & Scinto (57) ABSTRACT

A table positioning system including a first table, a first driving unit for moving the first table in a predetermined direction, a second table, a second driving unit for moving the second table relative to the first table, and a coupling device for transmitting a force between the first table and the second table in the predetermined direction. The coupling device is provided on front and rear side surfaces of the second table.

20 Claims, 11 Drawing Sheets

POSITIONING SYSTEM, EXPOSURE APPARATUS USING THE SAME, AND DEVICE MANUFACTURING METHOD

FIELD OF THE INVENTION AND RELATED ART

This invention relates generally to a positioning system and, in another aspect, the invention concerns an exposure apparatus using such a positioning system and a device manufacturing method based on the positioning system.

Figure 11A:
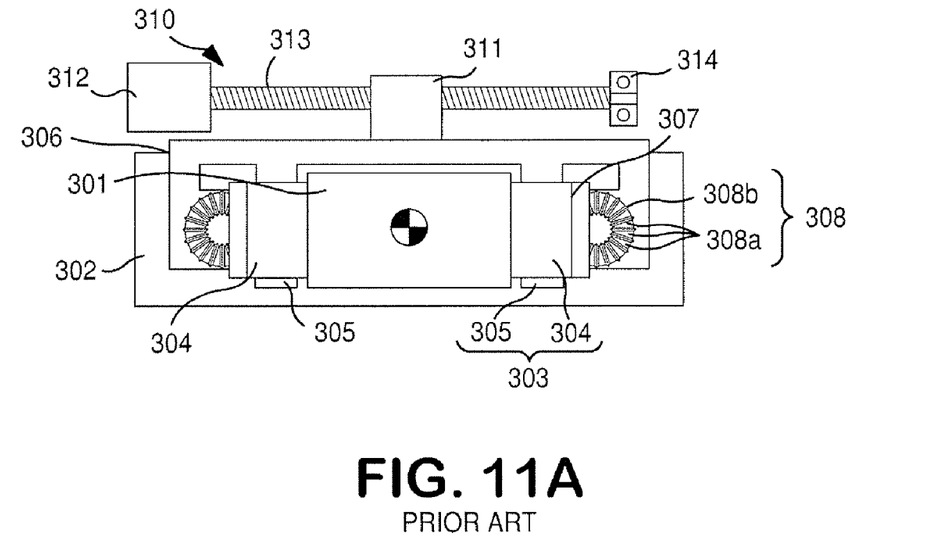
FIGS. 11A and 11B are schematic views, respectively, of a conventional stage system.
Figure 11B:
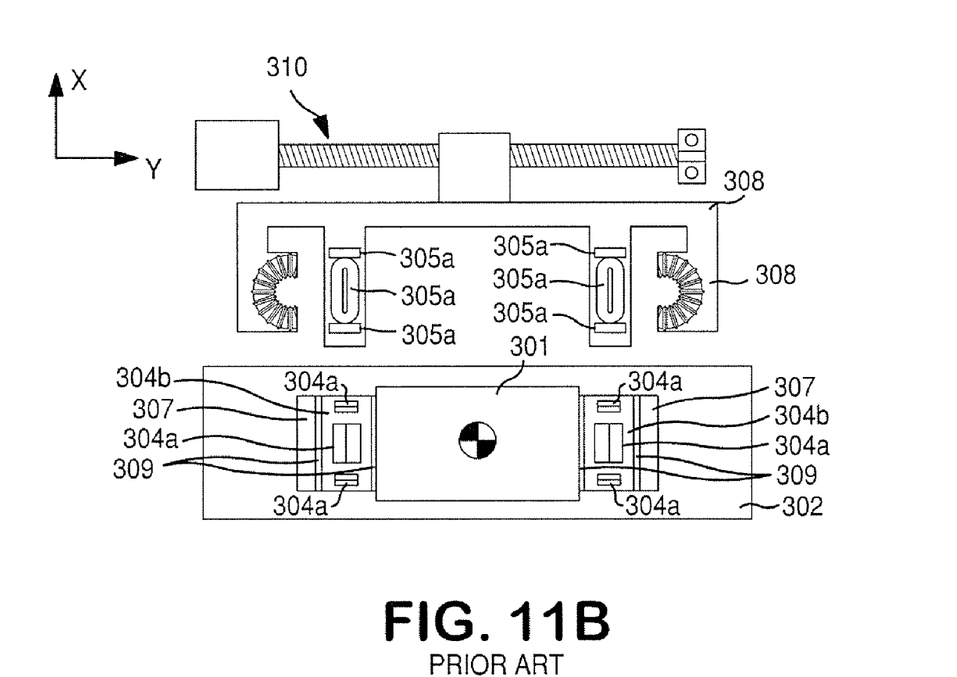

FIGS. 11A and 11B are schematic views, respectively, of a stage system of the type as disclosed in Japanese Laid-Open Patent Application, Publication No. 2000-106344. A flat guide 302 is fixed to a base (not shown), and this flat guide 302 supports a stage 301 that carries thereon a workpiece to be processed, for slidable motion along a dual-axis translational direction (X and Y) and a rotational direction (θ). A pair of linear motor movable elements 304 is fixed to the stage 301, at opposite sides thereof. Linear motor stators 305 are disposed opposed to these linear motor movable elements 304, respectively, without contact thereto. Each linear motor stator 305 is fixed to a nut 311 through a support frame 306.

A linear motor 303 for fine motion comprises a dual-pole magnet 304a and a single coil 305a, and a Lorentz's force is produced by the interaction between the coil electrical current and the magnet magnetic flux. The linear motor movable element 304 has an integral structure, comprising a dual-pole magnet 304a and a yoke 304b. The linear motor stator 305 comprises coils 305a having an elliptical shape. The linear motor 303 has six coils 305a, that is, coils Y1 and Y2 and coils X1, X2, X3 and X4. Each pair of coils X1 and X2 (coils X3 and X4; coils Y1 and Y2) have lines of action of force which are aligned with each other. A center line between the line of action of force of the coil X1 (or coil X2) and the line of action of force of the coil X3 (or coil X4), as well as the line of action of force of the coil Y1 (or coil Y2), extend through the gravity center (centroid) of the stage 301. Although only three coils are necessary for mere control of the stage with respect to the three axes, six coils are disposed symmetrically to make the mass distribution of the stage 301 symmetric. The linear motor 303 is provided with magnetic material plates 307 disposed to straddle over the stage as a whole. A pair of electromagnets 308 is provided to be opposed to these magnetic material plates, respectively.

The Y-axis long-stroke drive of this stage is provided by a feed screw driving system 310. The feed screw driving system 310 serves to convert rotational motion of a rotary motor 312 into straight motion with the use of a feed screw 313, and it functions to produce rough motion of the stage 301 through the nut 311. In order to transmit an acceleration force during an acceleration/deceleration period of this feed screw driving system 310 to the stage 301, an electrical current is applied to a coil 308a of the electromagnet 308 to produce an attracting force between the electromagnet 308 and the magnetic material plate 307. This reduces the load to the linear motor 303 during acceleration/deceleration, and it suppresses heat generation to be produced thereby.

However, when the electromagnet 308 and the magnetic material plate 307 are disposed as shown in FIGS. 11A and 11B, since the attracting force is transmitted to the stage through the linear motor 303, it is influenced by the rigidity of the linear motor. In a worst case, acceleration or deceleration of the stage may be retarded. Furthermore, since the linear motor 303 is disposed to sandwich the stage 301 with respect to the Y direction, the projected shape of the stage is elongated in the Y direction.

SUMMARY OF THE INVENTION

It is accordingly an object of the present invention to provide a positioning system by which a driving force of driving means can be transmitted efficiently to avoid delay of acceleration/deceleration of the stage and by which elongation of the stage can be avoided.

In accordance with an aspect of the present invention, to achieve the above object, there is provided a positioning system, comprising a first table, a second table, a second driving unit for relatively moving the second table relative to the first table, and coupling means effective to transmit a force produced by the first driving unit to the second table, wherein the coupling means includes couplings provided at least at opposite side surfaces with respect to a movement direction of the second table.

In one preferred form of this aspect of the present invention, when the first driving unit produces a force, the coupling means applies a force to the second table in a direction of the force of the first driving unit, by use of an electromagnetic force.

The second driving unit may preferably function to minutely move the second table with respect to the six-axis directions.

The coupling means may include a pair of couplings provided at central portions of opposite side surfaces with respect to the movement direction of the second table.

The coupling means may include two pairs of couplings provided at opposite side surfaces with respect to the movement direction of the second table.

The second table may have an opening formed at a central portion thereof, and the two pairs of couplings may be provided in a region outside the opening.

The second driving unit may be disposed between a top surface of the first table and a bottom surface of the second table.

The second driving unit may be disposed on a side surface of the second table and at a position where no electromagnetic joint is present.

Preferably, the line of action of the electromagnetic force at the coupling means may pass through a centroid position of a combined structure of the second table and a member mounted on the second table.

The present invention is applicable also to an exposure apparatus having such a positioning system as described above, and to a device manufacturing method for producing a semiconductor device by use of an exposure apparatus having such a positioning system.

In a positioning system according to the present invention, for example, an electromagnet or a magnetic material plate may be provided directly on a side surface of a stage, while a linear motor for fine motion may be provided at the bottom surface of the stage, and not at the side surface thereof.

When such a positioning system is applied as a reticle stage of the type that exposure light passes through a lens, since it has a large opening at the central portion thereof and, thus, the rigidity is lowered thereby, an electromagnet, if it is disposed at the center of a side wall having low rigidity, may cause deformation of the stage during acceleration or deceleration. In order to avoid this, two pairs of electromagnets and a magnetic material plate may preferably be provided at peripheral opposite positions, and not at the center, where the rigidity is relatively large.

The opposed surface of an electromagnet and a magnetic material plate may have an arcuate shape, being arcuate with respect to the rotational center of the stage, and this allows free rotation about the Z axis. Furthermore, by disposing them outside the stage, the area of opposed surfaces can be enlarged easily, such that the attraction force can be made to be large.

In accordance with the present invention, the driving force can be transmitted efficiently and, thus, retardation of stage acceleration or deceleration can be prevented. Elongation of the stage is thus avoided. In a fine-motion stage having a fine-motion fixed plate and a top plate, for example, electromagnetic coupling may be provided at the outer peripheral side faces of the top plate so as to sandwich the top plate at opposite sides with respect to the movement direction thereof. With such an arrangement, the acceleration force of a rough-motion linear motor can be transmitted to the top plate very efficiently. On that occasion, a fine-motion linear motor may be either disposed to be sandwiched between the fine-motion fixed plate and the top plate or disposed at the outer peripheral side face of the top plate, while avoiding the electromagnetic coupling. When the present invention is applied to a reticle top plate having a large opening formed at its center, two pairs of electromagnetic couplings may be provided at the opposite sides with respect to the movement direction of the top plate, specifically, at the location where the rigidity is relatively high. This prevents or reduces deformation of the top plate during acceleration. Furthermore, the opposed surfaces of the electromagnet may be formed into an arcuate shape, by which free rotation of the top plate is allowed. When the electromagnetic coupling is provided outside the top plate, the size of the top plate can be made smaller.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

Figure 1:
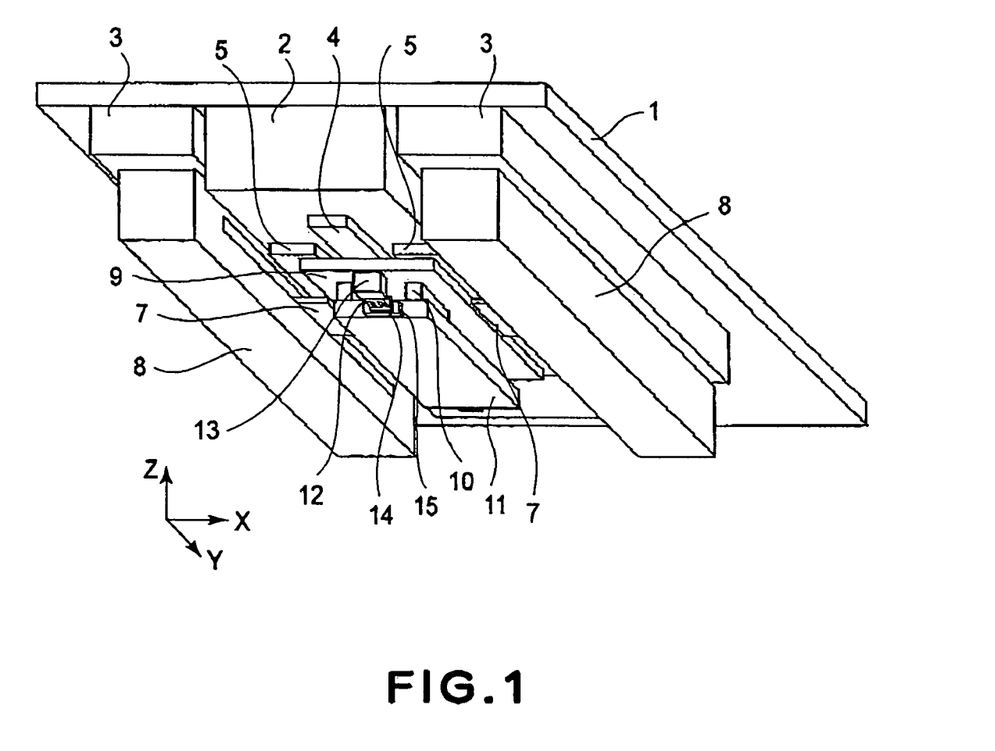
FIG. 1 is a schematic and perspective view of a reticle stage having a positioning system according to a first embodiment of the present invention, which is to be incorporated into a semiconductor exposure apparatus.
Figure 2A:
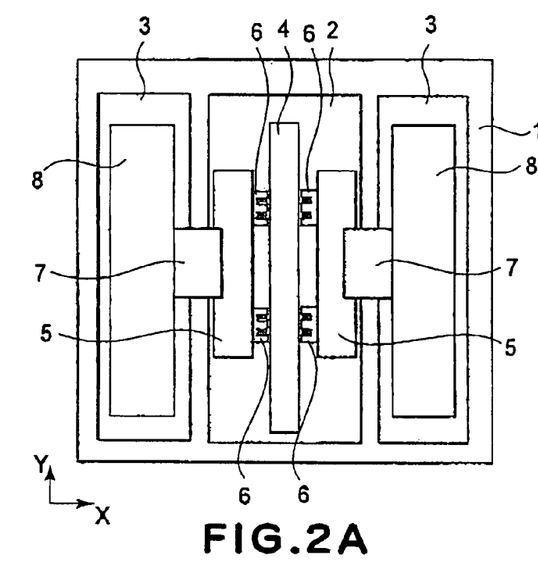
FIGS. 2A, 2B, 2C and 2D are plan views, respectively, of the reticle stage and components thereof according to the first embodiment shown in FIG. 1.
Figure 2B:
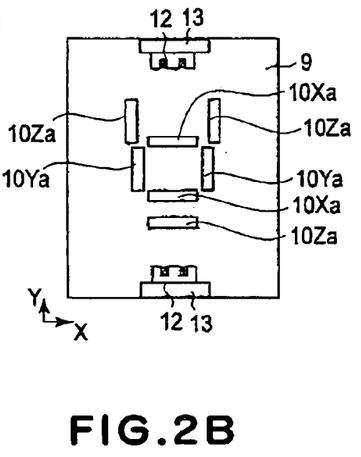
Figure 2C:
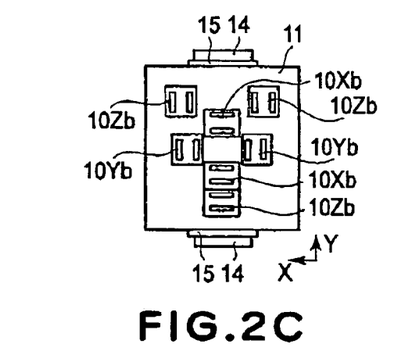
Figure 2D:
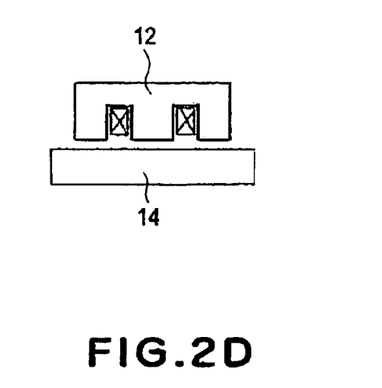

FIG. 1 is a schematic and perspective view of a reticle stage having a positioning system according to a first embodiment of the present invention. FIG. 2A is a bottom view of a rough-motion portion, and FIG. 2B is a bottom view of a fine-motion fixed unit. FIG. 2C is a plan view of a fine-motion movable unit, and FIG. 2D is an enlarged view of an electromagnetic coupling (joint). The exposure apparatus using this reticle stage is of the type having reflection type mirrors, since lenses are not usable with a short wavelength light source, such as EUV (extreme ultraviolet) light. The structure is upside down. In this embodiment, there is a base table 1 as a main base, and a slider base table 2 is mounted at the central portion of the base table 1. Further, there are Y base tables 3 mounted at the left- and right-hand sides of the slider base table 2. The slider base table 2 has Y feet 5 mounted thereon at the left- and right-hand sides of it. Each Y foot 5 is guided in the Z direction (vertical direction) by means of a static gas bearing (not shown) with respect to the slider base table 2, and each Y foot 5 is provided with a movable magnet 7.

As best seen in FIG. 2A, each Y foot 5 is provided with an E-shaped electromagnet 6 having a coil, and it is guided in the X direction without contact to a magnetic material plate 4 disposed at the center of the slider base table 2. Thus, the Y foot 5 can be moved in the Y direction by means of a driving force produced between the movable magnet 7, constituting first driving means, and a rough-motion linear motor stator 8 mounted on the Y base table 3. The Y foot 5 carries thereon a fine-motion fixed plate 9 on which a reticle top plate 11 is mounted through a six-axis linear motor 10 for fine motion, whereby a reticle supporting spring (not shown) is provided between the fine-motion fixed plate 9 and the reticle top plate 11 for supporting the weight of the reticle top plate 11.

The fine-motion linear motor 10 as second driving means is disposed to be sandwiched between the reticle top plate 11 and the fine-motion fixed plate 9. As best seen in FIG. 2B, it comprises stators 10Xa, 10Ya and 10Za having coils (not shown), which are mounted on the fine-motion fixed plate 9. On the other hand, movable elements 10Xb, 10Yb and 10Zb having magnets are mounted on the reticle top plate 11. The stator 10Xa and the movable element 10Xb produce a thrust in the X direction, and the stator 10Ya and the movable element 10Yb produce a thrust in the Y direction. The stator 10Za and the movable element 10Zb produce a thrust in the Z direction.

Magnetic material plates 14 are mounted on the side faces of the reticle top plate 11, at opposite sides with respect to the Y direction, through mounting plates 15, respectively. The fine-motion fixed plate 9 has E-shaped electromagnets 12 with coils, each being mounted through a mounting plate 13 to be opposed to the magnetic plate material 14 with a predetermined clearance. As best seen in FIG. 2D, the E-shaped electromagnet 12 and the magnetic material plate 14 are disposed to be opposed to each other. As an electrical current is applied to the coil of the E-shaped electromagnet 12, an attracting force is produced between them, and it function as an electromagnetic coupling (joint). More specifically, it means that, when an acceleration force is produced at the Y foot 5 and the fine-motion fixed plate 9 in response to a thrust force caused between the linear motor 8 for rough motion and the movable magnet 7, in order to transmit this acceleration force to the reticle top plate 11, an attraction force is produced between the E-shaped electromagnet 12 and the magnetic material plate 14 (no load is applied to the fine-motion linear motor 10 during acceleration and deceleration). In the conventional structure shown in FIGS. 11A and 11B, because of the intervention of the fine-motion linear motor 305 between the magnetic material plate 307 and the stage 301 (corresponding to the fine-motion fixed plate), transmission of an acceleration force may be retarded if the rigidity of the linear motor portion is weak. In this embodiment of the present invention, as compared therewith, since there is only a mounting plate 15 (which can be regarded as being a rigid member) present between the magnetic material plate 14 and the reticle top plate 11, the transmission occurs very well. Obviously, the mounting plate 13 for the E-shaped electromagnet 12 should have a sufficiently large rigidity. The line of action of the attracting force should preferably pass through the gravity center (centroid) position of a combined structure, including the reticle top plate 11 and the linear motor, and so on, mounted on the top plate.

Embodiment 2

Figure 3:
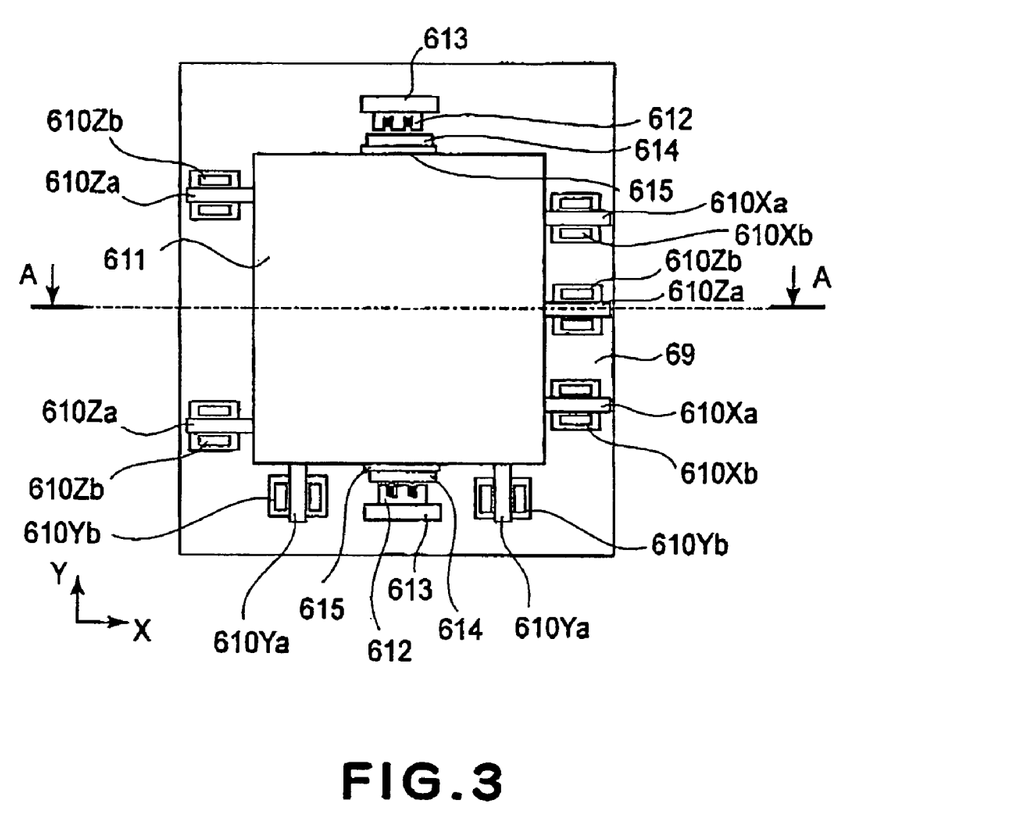
FIG. 3 is a schematic and plan view of a fine-motion unit of a reticle stage, having a positioning system according to a second embodiment of the present invention, which is to be incorporated into a semiconductor exposure apparatus.
Figure 4:
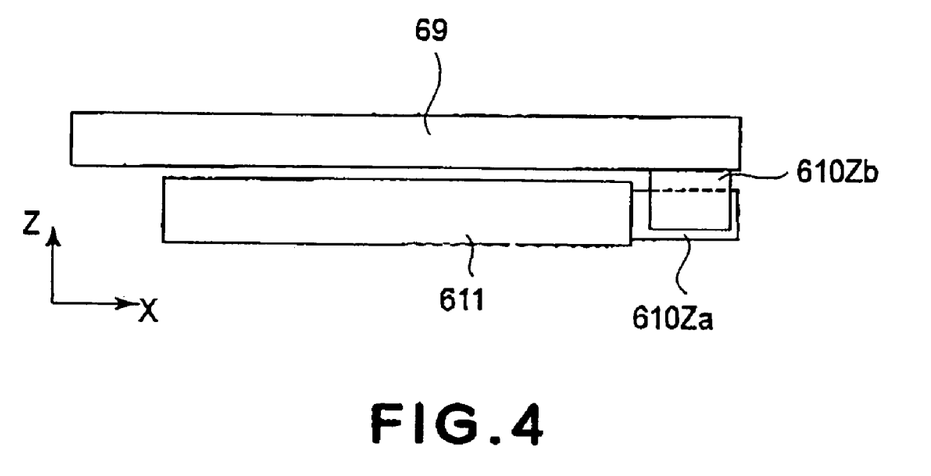
FIG. 4 is a sectional view taken on a line A-A in FIG. 3.

FIG. 3 is a schematic and bottom view of the fine-motion portion of a reticle stage according to a second embodiment of the present invention, as viewed upwardly from below. FIG. 4 is a sectional view taken on a line A-A in FIG. 3. This embodiment, as well, concerns an example wherein reflection type mirrors are used because no lenses are usable with a short wavelength light source, such as EUV, and the structure is upside down.

Like the first embodiment, the reticle stage includes a reticle top plate 611, as well as magnetic material plates 614, which are mounted on the opposite side faces of the reticle top plate 611 with respect to the Y direction, through mounting plates 615, respectively. A fine-motion fixed plate 69 is provided with E-shaped electromagnets 612 having coils, each being disposed opposed to the magnetic material plate 614 with a predetermined clearance, through a mounting plate 613. On the other hand, a linear motor for fine motion includes stators 610Xa, 610Ya and 610Za having coils (not shown), which are mounted on the fine-motion fixed plate 69. Also, movable elements 610Xb, 610Yb and 610Zb having magnets are mounted on the side faces of the reticle top plate 611, while avoiding the electromagnets. The stator 610Xa and the movable element 610Xb produce a thrust in the X direction, and the stator 610Ya and the movable element 610Yb produce a thrust in the Y direction. The stator 610Za and the movable element 610Zb produce a thrust in the Z direction.

Tilt control of the reticle top plate 611 requires the use of three Z-axis thrust producing linear motors. Hence, one linear motor is provided at the central portion of one side surface of the reticle top plate 611, while the remaining two linear motors are provided at peripheral positions on another side surface being opposite to the one side surface. If these linear motors are provided at opposite sides with respect to the movement direction (Y direction) of the reticle top plate 611, it may cause interference with the electromagnets. In consideration of this, in this embodiment, these linear motors are disposed on the opposite side surfaces with respect to a direction perpendicular to the movement direction, namely, with respect to the X direction.

In accordance with this embodiment, as compared with the first embodiment, the thickness of the fine-motion portion of the reticle stage can be made small.

Embodiment 3

Figure 5:
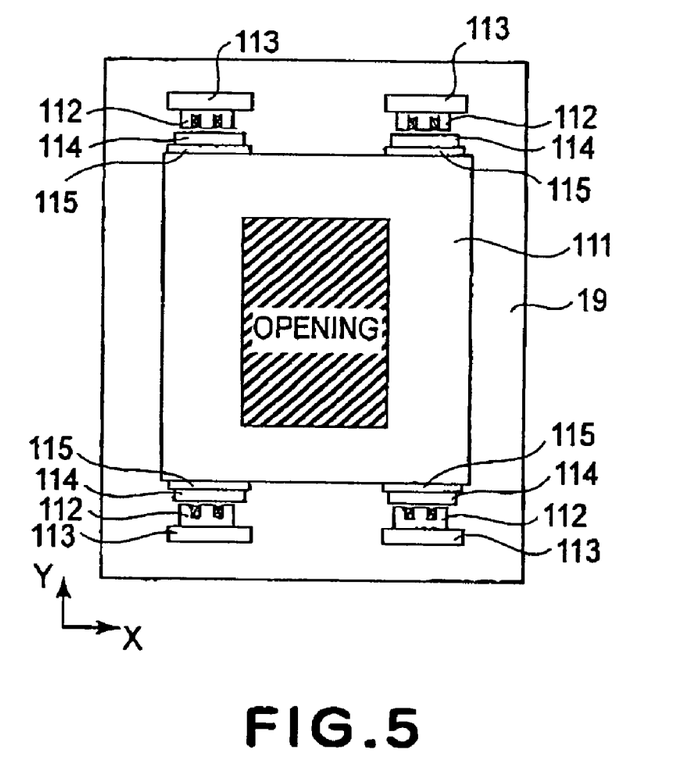
FIG. 5 is a schematic and plan view of a fine-motion unit of a reticle stage, having a positioning system according to a third embodiment of the present invention, which is to be incorporated into a semiconductor exposure apparatus.

FIG. 5 is a schematic and bottom view of a reticle stage according to a third embodiment of the present invention, as viewed upwardly from below. This embodiment concerns an example of an exposure apparatus having a light source, such as KrF, ArF, or the like, with which lenses are usable. A fine-motion fixed plate 19 and a reticle top plate 111 have a central opening for transmission of exposure light, and the structure is normal (not upside down).

Figure 6:
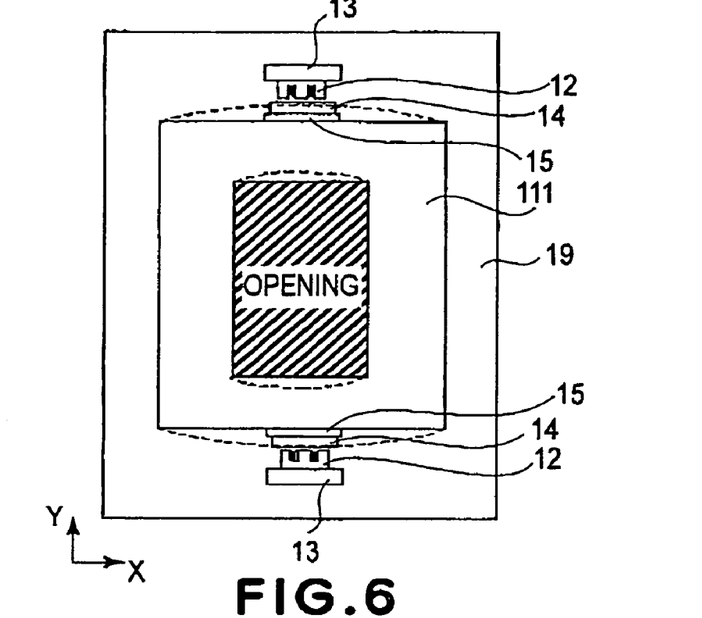
FIG. 6 is a plan view for explaining deformation of a reticle top plate.

Since the reticle top plate 111 having such a central opening is weak in rigidity, if the E-shaped electromagnets 12 and the magnetic material plates 14 are disposed at central portions on the opposite side surfaces with respect to the Y direction, as shown in FIG. 6, the reticle top plate 111 may cause deformation as depicted by the broken lines in the drawing, due to the attracting force of the electromagnets as applied during an acceleration or a deceleration period. In order to avoid this, in this embodiment, as shown in FIG. 5, magnetic material plates 114 are disposed at left- and right-hand side positions (having high rigidity) on the opposite side surfaces of the reticle top plate 111 with respect to the Y direction, and E-shaped electromagnets 112 are mounted on the fine-motion fixed plate 19 so as to be opposed to these magnetic plates. The fine-motion fixed plate 19, as well, has a large opening at its center, so the E-shaped electromagnets 12 are disposed at positions having high rigidity. Each E-shaped electromagnet 112 is mounted on the fine-motion fixed plate 19 through a mounting plate 113, while the magnetic material plate 114 is mounted on the side face of the reticle top plate 111 through a mounting plate 115. The lines of action of these two pairs of electromagnetic couplings may preferably be at positions being symmetric with respect to the centroid position of a combined structure including the reticle top plate 111 and members mounted thereon. Although the fine-motion linear motor is not illustrated in the drawing for simplicity, it may be provided between the reticle top plate 111 and the fine-motion fixed plate 19, as in the first embodiment or, alternatively, it may be disposed at the side face of the reticle top plate 111 while avoiding the electromagnetic couplings, as in the second embodiment. Particularly, when it is used in an exposure apparatus of an exposure light transmission type, as in this embodiment, if the thickness of the fine-motion portion of the reticle stage is made small, the distance between the light source and the lens can be made shorter and, thus, the lens diameter can be made smaller. Therefore, it is desirable to place the fine-motion linear motor on a side surface of the reticle top plate 111.

Embodiment 4

Figure 7:
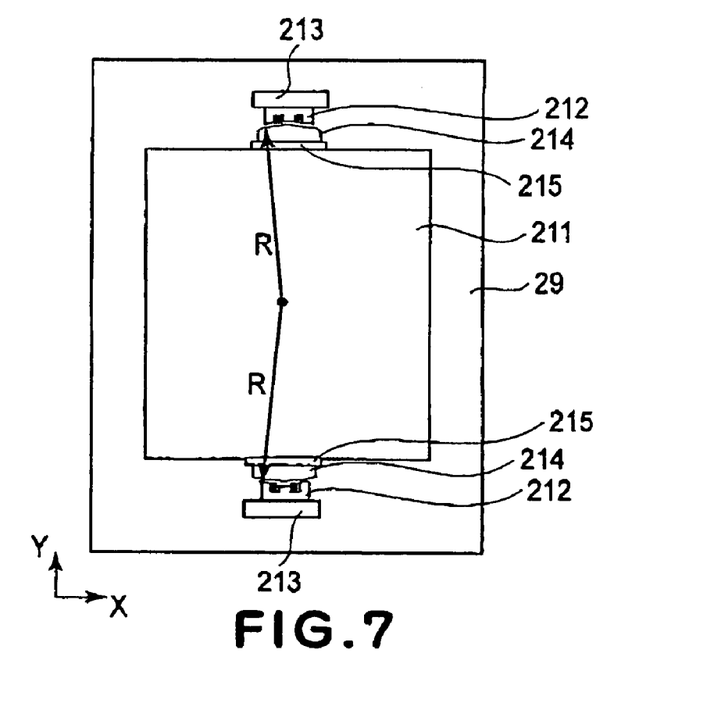
FIG. 7 is a schematic and plan view of a fine-motion unit of a reticle stage, having a positioning system according to a fourth embodiment of the present invention, which is to be incorporated into a semiconductor exposure apparatus.

FIG. 7 is a schematic and bottom view of a fine-motion portion of a reticle stage according to a fourth embodiment of the present invention, as seen upwardly from below. In this embodiment, the structure is upside down as in the first and second embodiments.

There are magnetic material plates 214 disposed at central portions of opposite side surfaces of a reticle top plate 111 with respect to the Y direction, and E-shaped electromagnets 212 are mounted on a fine-motion fixed plate 214, respectively. Each E-shaped electromagnet 212 is mounted on the fine-motion fixed plate 29 through a mounting plate 213, while each magnetic material plate 214 is mounted on a side face of the reticle top plate 111 through a mounting plate 215. The opposed surfaces of the E-shaped electromagnet 212 and the magnetic material plate 214 are formed into an arcuate shape, being arcuate with respect to the rotational center of the reticle top plate 111. By use of such an arcuate-shape structure, free rotation about the Z axis of the E-shaped electromagnet 212 and the magnetic material plate 214 is enabled without contact with each other. Furthermore, no change occurs in the clearance between them during the rotation, and the attraction force to be produced by the electromagnet in response to the same (constant) electrical current does not change.

Embodiment 5

Figure 8:
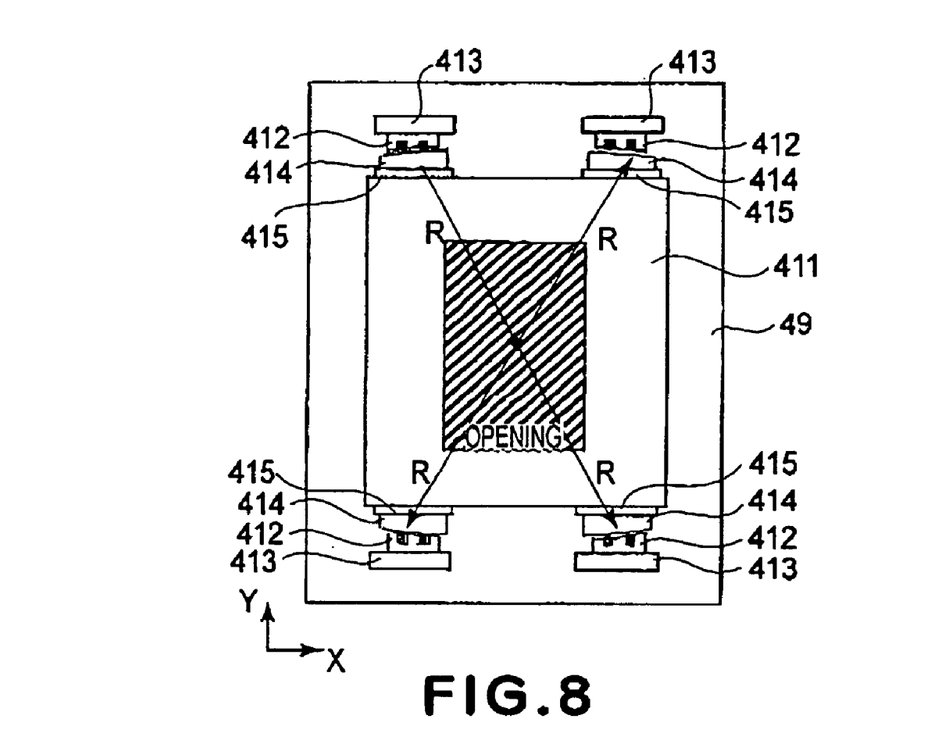
FIG. 8 is a schematic and plan view of a fine-motion unit of a reticle stage, having a positioning system according to a fifth embodiment of the present invention, which is to be incorporated into a semiconductor exposure apparatus.

FIG. 8 is a schematic and plan view of a fine-motion portion of a reticle stage according to a fifth embodiment of the present invention, as seen from above. In this embodiment, the structure is normal, as in the third embodiment.

There are magnetic material plates 414 disposed at left- and right-hand positions on opposite side surfaces of a reticle top plate 411 with respect to the Y direction, and E-shaped electromagnets 412 are mounted on a fine-motion fixed plate 49 to be opposed to the magnetic plates 414, respectively. Each E-shaped electromagnet 412 is mounted on the fine-motion fixed plate 49 through a mounting plate 413, while each magnetic material plate 414 is mounted on a side face of the reticle top plate 411 through a mounting plate 415. The opposed surfaces of the E-shaped electromagnet 412 and the magnetic material plate 414 are all formed into an arcuate shape, being arcuate with respect to the rotational center of the reticle top plate 411. By use of such an arcuate-shape structure, as in the fourth embodiment, free rotation about the Z axis of the E-shaped electromagnet 412 and the magnetic material plate 414 is enabled without contact with each other. Furthermore, no change occurs in the clearance between them during the rotation, and the attraction force to be produced by the electromagnet in response to the same (constant) electrical current does not change. Additionally, as in the second embodiment, deformation of the reticle top plate 411 and of the fine-motion fixed plate 49 to be otherwise caused by the attraction force of the electromagnets can be avoided or reduced.

Embodiment 6

Figure 9:
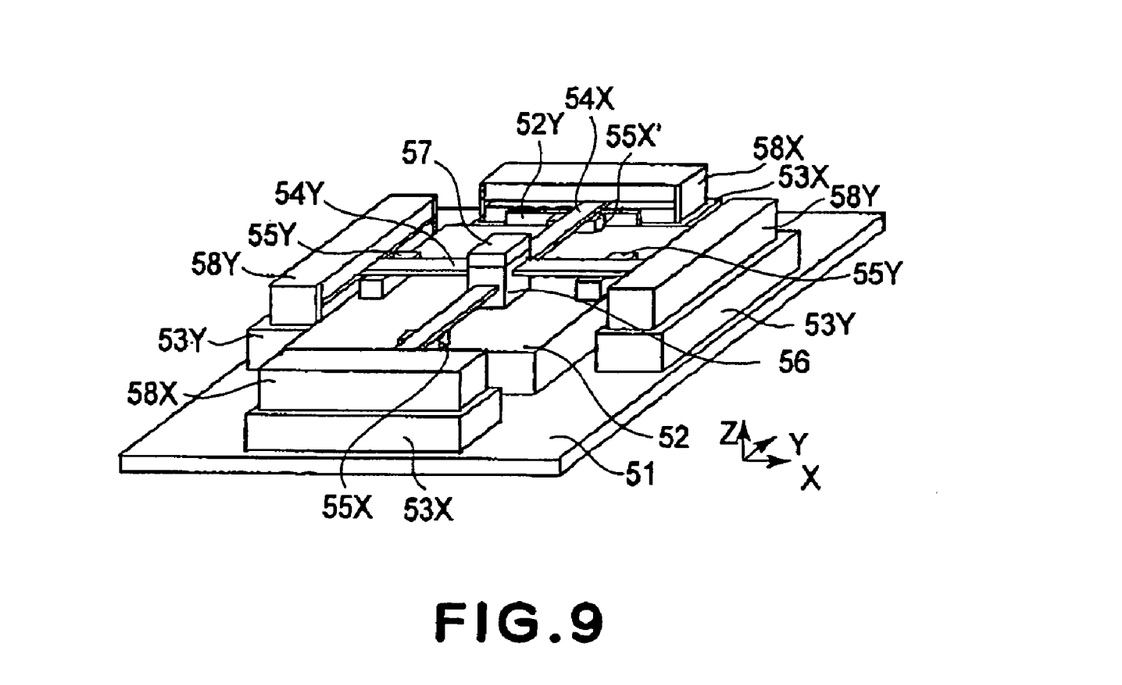
FIG. 9 is a schematic and perspective view of a wafer stage, having a positioning system according to a sixth embodiment of the present invention, which is to be incorporated into a semiconductor exposure apparatus.

FIG. 9 is a schematic and perspective view of a wafer stage according to a sixth embodiment of the present invention. In this embodiment, a base table 51 has a slider base table 52 mounted thereon at the central portion thereof. Mounted around the slider base table 52 are an X base table 53*x* and a Y base table 53Y. The X base table 53*x* carries thereon a stator 58X of a rough-motion linear motor for moving an X beam 54*x* in the X direction, and the Y base table 53Y carries thereon a stator 58Y of a rough-motion linear motor for moving a Y beam 54Y in the Y direction. At the intersection between the X beam 54*x* and the Y beam 54Y, there is an X-Y slider 56. The X beam 54*x*, the Y beam 54Y and the X-Y slider 56 are respectively supported without contact (although not shown in the drawing), such that the X-Y slider 56 can be moved smoothly in response to the driving of the beams. Mounted on the X-Y slider 56 is a six-axis fine-motion stage 57 and, when a wafer chuck is mounted thereon, they constitute a wafer stage. There are Y feet 55*y* at the opposite ends of the Y beam 54Y, on which static gas bearings (not shown) are to be mounted. The Y feet are guided by the static gas bearing means in a vertical direction (Z-axis direction) relative to the slider base table 52. Denoted at 55X and 55X' are X feet, which are provided at the opposite ends of the X beam 54. The X feet 55X and 55X' are guided by static gas bearing means (not shown) in the vertical direction (Z-axis direction) relative to the stage base table 52. Furthermore, the X foot 55X', which is at the rear side as viewed in the drawing, is guided also by static gas bearing means (not shown) in a horizontal direction (Y-axis direction) relative to a Y guide 52Y, mounted on the stage base table 52. The X-Y slider 56, as well, is guided by static gas bearing means (not shown) provided at the bottom thereof, in the vertical direction (Z-axis direction), relative to the stage base table 52.

Figure 10A:
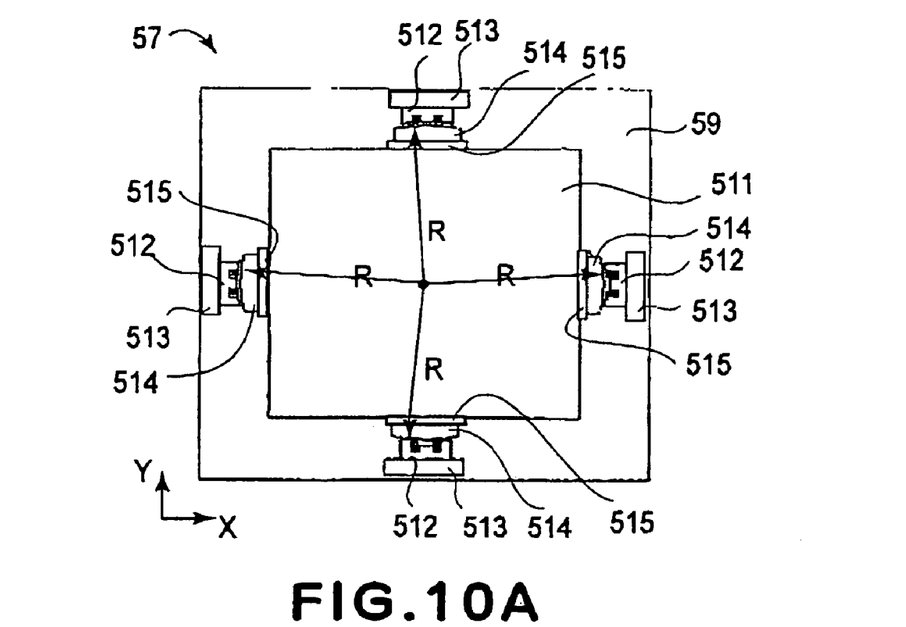
FIGS. 10A, 10B and 10C are plan views, respectively, showing components of the fine-motion unit of the FIG. 9 embodiment.
Figure 10B:
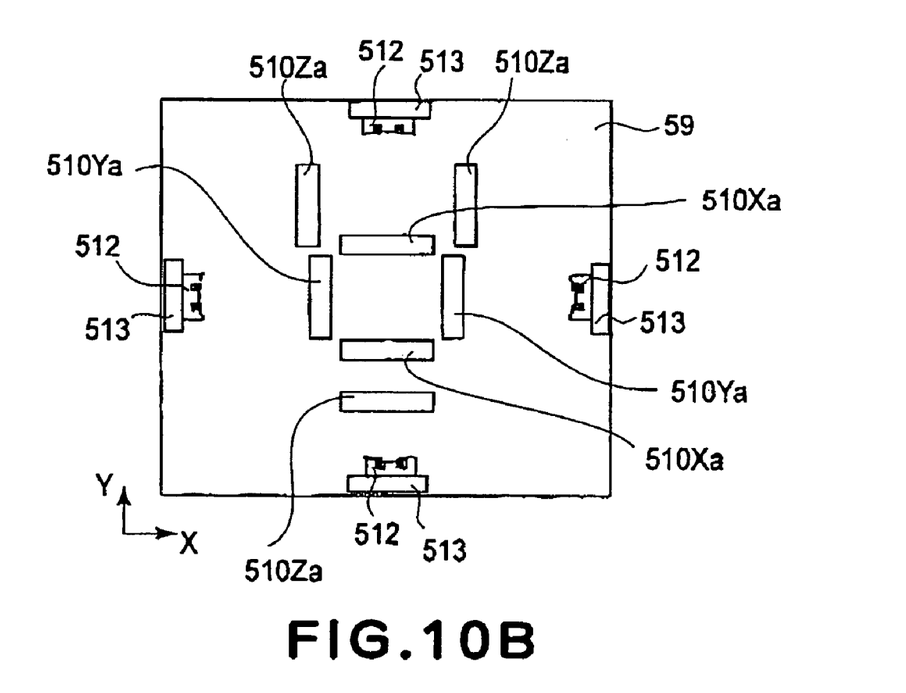
Figure 10C:
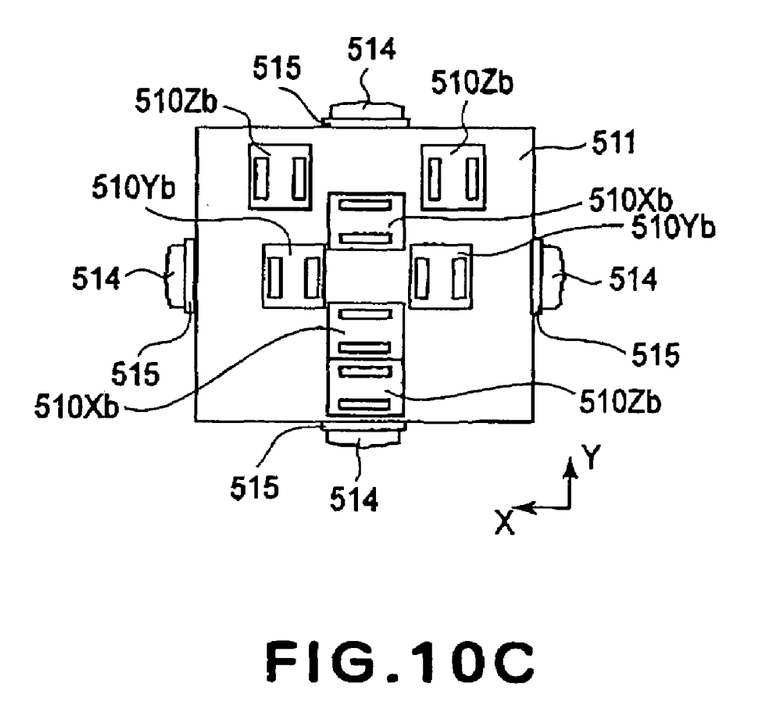

Next, the six-axis fine-motion stage 57 will be explained in detail. FIG. 10A is a plan view of the fine-motion stage 57 as seen from above. FIG. 10B is a plan view of a fine-motion fixed plate 59 as seen from above. FIG. 10C is a bottom view of a wafer top plate 511 as seen from below. The fine-motion stage 57 comprises a fine-motion fixed plate 59 and a wafer top plate 511, and there is a self-weight supporting spring (not shown) provided between them to support the weight of the wafer top plate 511. A linear motor for fine motion is disposed to be sandwiched between the fine-motion fixed plate 59 and the reticle top plate 511. As seen in FIG. 10B, stators 510Xa, 510Ya and 510Za having coils (not shown) are mounted on the fine-motion fixed plate 59, while movable elements 510Xb, 510Yb and 510Zb, such as shown in FIG. 10C and having magnets (not shown) are mounted on the wafer top plate 511. The stator 510Xa and the movable element 510Xb produce a thrust in the X direction, and the stator 510Ya and the movable element 510Yb produce a thrust in the Y direction. The stator 510Za and the movable element 510Zb produce a thrust in the Z direction.

Magnetic material plates 14 are mounted on the four peripheral side surfaces of the wafer top plate 511 through mounting plates 515, respectively. E-shaped electromagnets 512 with coils are mounted on the fine-motion fixed plate 59 through mounting plates 513 so as to be opposed to the magnetic material plates 514, respectively. As the E-shaped electromagnet 12 and the magnetic material plate 14 are disposed opposed to each other, when an electrical current is applied to the coil of the E-shaped electromagnet 12, an attracting force is produced between them, and it functions as an electromagnetic coupling (joint). More specifically, it means that, when an acceleration force is produced at the X-Y slider 56 and the fine-motion fixed plate 59 in response to a thrust force caused between the rough-motion linear motor stators 58*x* and 58Y and movable magnets (not shown) mounted at the free end portions of the X foot 54*x* and Y foot 54Y, respectively, in order to transmit this acceleration force to the wafer top plate 511, an attraction force is produced between the E-shaped electromagnet 512 and the magnetic material plate 514. The opposed surfaces of the E-shaped electromagnet 512 and the magnetic material plate 514 are formed into an arcuate shape, being arcuate with respect to the rotational center of the wafer top plate 511 (it is not always necessary that the arcs have the same radius). By use of such an arcuate-shaped structure, free rotation about the Z axis of the E-shaped electromagnet 512 and the magnetic material plate 514 is enabled without contact to each other. Furthermore, no change occurs in the clearance between them during the rotation, and the attraction force to be produced by the electromagnet in response to the same (constant) electrical current does not change. Obviously, the line of action of the attracting force to be produced between the E-shaped electromagnet 512 and the magnetic material plate 514 should preferably pass the centroid position of a combined structure including the wafer top plate 511 and the linear motors, and the like, mounted thereon.

As regards the structure of the fine-motion portion of a wafer stage, Japanese Laid-Open Patent Application, Publication No. 2003-22960, shows an example. In this example, however, an electromagnetic coupling that comprises an E-shaped electromagnet and a magnetic material plate is not disposed at the outer periphery side of a wafer top plate, but rather it is disposed at the center and placed to be sandwiched between a fine-motion fixed plate and the wafer top plate. As a result, in order to obtain a predetermined area size at the opposed surfaces of the E-shaped electromagnet and the magnetic material plate, the wafer top plate has to be made much larger as compared with the present invention and, thus, the dynamic characteristic would be degraded considerably. Furthermore, although in the present invention, the magnetic material plate mounted on the wafer top plate can be regarded as being a rigid member, in the structure disclosed in Japanese Laid-Open Patent Application, Publication No. 2003-22960, deformation of the magnetic material itself would cause retardation of the acceleration force transmission.

Embodiment 7

Figure 12:
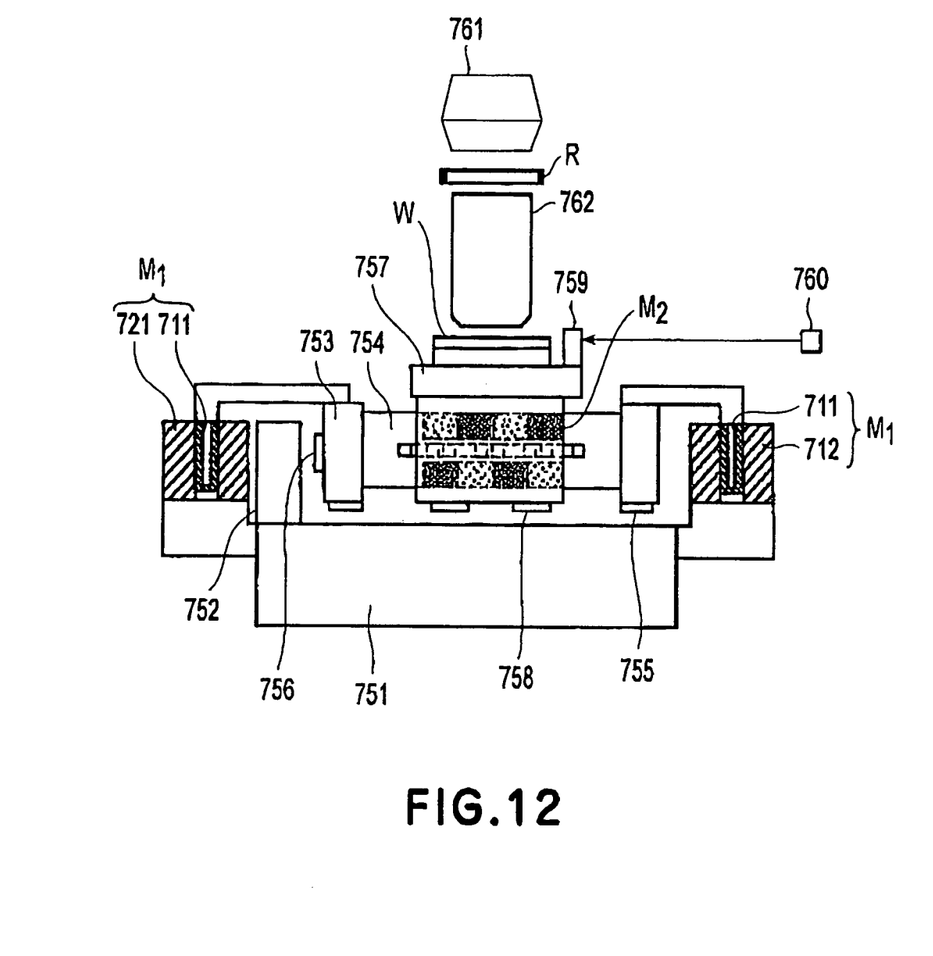
FIG. 12 is an elevational view of an exposure apparatus for semiconductor device manufacture, having a stage with a positioning system of the present invention as a wafer stage.

FIG. 12 shows an exposure apparatus for semiconductor device manufacture which includes, as a wafer stage, a stage having a positioning system with substantially the same structure as has been described with reference to the sixth embodiment.

This exposure apparatus is to be used for the manufacture of microdevices having a fine pattern formed thereon, such as semiconductor devices (semiconductor integrated circuits, for example), micromachines, or thin-film magnetic heads, for example. In this exposure apparatus, exposure light (which may include visible light, ultraviolet light, EUV light, X-rays, an electron beam, and a charged particle beam, for example) as exposure energy supplied from a light source 761 illuminates a reticle R (original), and light from the reticle R is projected onto a semiconductor wafer W (substrate) through a projection system having a projection lens 762 (which may include a refractive lens, a reflective lens, a catadioptric lens system, and a charged particle lens, for example), wherein a desired pattern is produced on the substrate.

The exposure apparatus includes a base table 751 having a guide 752 and a linear motor stator 721 fixed thereto. The linear motor stator 721 has a multiple-phase electromagnetic coil, while a linear motor movable element 711 includes a permanent magnet group. The linear motor movable portion 711 is connected as a movable portion 753 to a movable guide 754 (stage), and through the drive of the linear motor M1, the movable guide 754 can be moved in a direction of a normal to the sheet of the drawing. The movable portion 753 is supported by a static bearing 755, taking the upper surface of the base table 751 as a reference, and also by a static bearing 756, taking the side surface of the guide 752 as a reference.

A movable stage 757, which is a stage member disposed to straddle the movable guide 754, is supported by a static bearing 758. This movable stage 757 includes a positioning system similar to what has been described with reference to the sixth embodiment, and it is driven by a similar linear motor M2, so that the movable stage 757 moves leftwardly and rightwardly as viewed in the drawing, while taking the movable guide 754 as a reference. The motion of the movable stage 757 is measured by means of an interferometer 760 and a mirror 759, which is fixed to the movable stage 757.

A wafer (substrate) W is held on a chuck, which is mounted on the movable stage 757, and a pattern of the reticle R is transferred in a reduced scale onto different regions on the wafer W by means of the light source 761 and the projection optical system 762, in accordance with a step-and-repeat method or a step-and-scan method.

It should be noted that the substrate attracting device described hereinbefore can also be similarly applied to an exposure apparatus in which, without using a mask, a circuit pattern is directly drawn on a semiconductor wafer to expose a resist thereon.

Next, an embodiment of a semiconductor device manufacturing process, which uses an exposure apparatus described above, will be explained.

Figure 13:
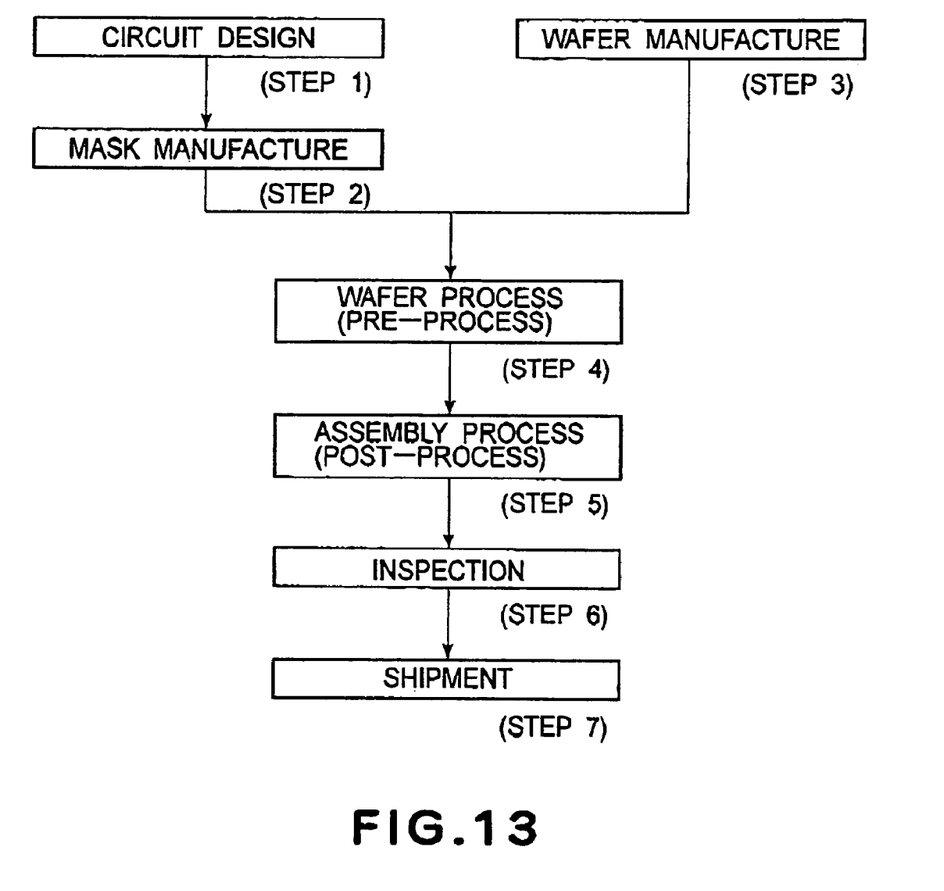
FIG. 13 is a flow chart of a general procedure for manufacturing semiconductor devices.

FIG. 13 is a flow chart for explaining the overall procedure for semiconductor manufacture. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5 are carried out. With these processes, semiconductor devices are produced, and they are shipped (step 7).

More specifically, the wafer process at step 4 described above includes (i) an oxidation process for oxidizing the surface of a wafer, (ii) a CVD process for forming an insulating film on the wafer surface, (iii) an electrode forming process for forming electrodes upon the wafer by vapor deposition, (iv) an ion implanting process for implanting ions to the wafer, (v) a resist process for applying a resist (photosensitive material) to the wafer, (vi) an exposure process for printing, by exposure, the circuit pattern of the mask on the wafer through the exposure apparatus described above, (vii) a developing process for developing the exposed wafer, (viii) an etching process for removing portions other than the developed resist image, and (ix) a resist separation process for separating the resist material remaining on the wafer after being subjected to the etching process. By repeating these process, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-048921 filed Feb. 25, 2004, which is hereby incorporated by reference.

What is claimed is:

1. A table positioning system, comprising:
   a first table;
   a first driving unit for moving said first table in a predetermined direction;
   a second table;
   a second driving unit for moving said second table relative to said first table; and
   coupling means for transmitting a force between said first table and said second table in said predetermined direction,
   wherein said coupling means is provided on front and rear side surfaces of said second table.

2. A table positioning system according to claim 1, wherein said coupling means comprises an electromagnetic coupling, and wherein, when said first driving unit applies a force to said first table, said electromagnetic coupling applies a force between said first table and said second table.

3. A table positioning system according to claim 1, wherein said second driving unit functions to minutely move said second table with respect to six-axis direction.

4. A table positioning system according to claim 1, wherein said coupling means includes a pair of couplings provided at central portions of said front and rear side surfaces.

5. A table positioning system according to claim 1, wherein said coupling means includes two pairs of couplings.

6. A table positioning system according to claim 5, wherein said second table has an opening formed at a central portion thereof, and wherein said two pairs of couplings are provided in a region outside the opening.

7. A table positioning system according to claim 4, wherein said second driving unit is disposed between a top surface of said first table and a bottom surface of said second table.

8. A table positioning system according to claim 1, wherein said second driving unit includes linear motors for moving said second table in upward and downward directions, and wherein said linear motors are provided on left and right side surfaces of said second table, respectively.

9. A table positioning system according to claim 1, wherein a line of action of the electromagnetic force at said coupling means passes through a centroid position of a combined structure of said second table and a member mounted on said second table.

10. A table positioning system according to claim 5, wherein lines of action of said two pairs of couplings are at positions being symmetrical with each other with respect to a centroid position of a combined structure of said second table and a member mounted on said second table.

11. A table positioning system according to claim 1, wherein said coupling means includes an electromagnet and a magnetic material plate opposed to said electromagnet, and wherein opposing surfaces of said electromagnet and said magnetic material plate have an arcuate shape.

12. A table positioning system according to claim 11, wherein said arcuate shape is defined as arcuate with respect to the center of rotation of said second table.

13. An exposure apparatus including a table positioning system as recited in claim 1, for positioning at least one of an original and a substrate.

14. A device manufacturing method comprising:
   exposing a substrate to a pattern using an exposure apparatus as recited in claim 13 in order to print the pattern onto the substrate;
   developing the exposed substrate; and
   assembling the developed substrate to manufacture a device.

15. A table positioning system, comprising:
   a first table;
   a first driving unit for moving said first table in a predetermined direction;
   a second table having an opening at a central position thereof;
   a second driving unit for moving said second table relative to said first table; and
   coupling means having first members provided on said first table and second members provided on said second table, for transmitting a force between said first table and second table in said predetermined direction,
   wherein said second members are provided on front and back side surfaces of said second table, and
   wherein said second members are provided in a region outside the opening.

16. A table positioning system, comprising:
   a first table;
   a first driving unit for moving said first table in a predetermined direction;
   a second table having an opening at a central position thereof;
   a second driving unit for moving said second table relative to said first table; and
   coupling means having first members provided on said first table and second members provided on said second table, for transmitting a force between said first table and second table in said predetermined direction,
   wherein said second members are provided on front and rear side surfaces of said second table, and
   wherein said second members are provided at opposite sides of said opening.

17. A scanning exposure apparatus, comprising:
   a positioning system for positioning an original, said positioning system including (i) a first table, (ii) a first driving unit for moving said first table in a scanning direction, (iii) a second table having a holding member for holding said original and an opening, (iv) a second driving unit for moving said second table relative to said first table, and (v) coupling means having first members provided on said first table and second members provided on said second table, for transmitting a force between said first table and second table in said scanning direction,
   wherein said second members are provided on front and rear side surfaces of said second table, and
   wherein said second members are provided in a region outside the opening.

18. A scanning exposure apparatus, comprising:
   a positioning system for positioning an original, said positioning system including (i) a first table, (ii) a first driving unit for moving said first table in a scanning direction, (iii) a second table having holding member for holding said original; (iv) a second driving unit for moving said second table relative to said first table, and (v) coupling means having first members provided on said first table and second members provided on said second table, for transmitting a force between said first table and second table in said scanning direction, wherein said second members are provided on front and rear side surfaces of said second table, and wherein said second members are provided at opposite sides of said opening.

19. A scanning exposure apparatus according to claim 17, wherein said coupling means includes magnetic couplings.

20. A scanning exposure apparatus according to claim 18, wherein said coupling means includes magnetic couplings.

* * * * *